(12) United States Patent
Joshi et al.

(10) Patent No.: US 11,685,543 B1
(45) Date of Patent: Jun. 27, 2023

(54) VIBRATING ACTUATOR BASED HYBRID COOLING SYSTEMS FOR ELECTRIC MACHINES

(71) Applicant: TOYOTA MOTOR ENGINEERING & MANUFACTURING NORTH AMERICA, INC., Plano, TX (US)

(72) Inventors: Shailesh N. Joshi, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 0 days.

(21) Appl. No.: 17/703,008

(22) Filed: Mar. 24, 2022

(51) Int. Cl.
| | | |
|---|---|---|
| *B64D 33/08* | (2006.01) | |
| *H05K 7/20* | (2006.01) | |
| *B64D 27/24* | (2006.01) | |
| *B64C 29/00* | (2006.01) | |

(52) U.S. Cl.
CPC ............. *B64D 33/08* (2013.01); *B64D 27/24* (2013.01); *H05K 7/2039* (2013.01); *H05K 7/20345* (2013.01); *B64C 29/00* (2013.01)

(58) Field of Classification Search
CPC .................................. B64D 33/08; B64C 20/00
See application file for complete search history.

(56) References Cited

U.S. PATENT DOCUMENTS

| | | | |
|---|---|---|---|
| 2014/0250929 A1* | 9/2014 | Takahashi | F25B 41/24 62/115 |
| 2015/0033724 A1 | 2/2015 | Fong et al. | |
| 2015/0151844 A1 | 6/2015 | Anton et al. | |
| 2015/0372568 A1 | 12/2015 | Korner | |
| 2016/0009388 A1 | 1/2016 | Brotherton-Ratcliffe et al. | |
| 2017/0057650 A1 | 3/2017 | Walter-Robinson | |
| 2018/0077826 A1* | 3/2018 | Okita | B64C 25/36 |
| 2020/0144894 A1 | 5/2020 | Teofili | |
| 2021/0317835 A1* | 10/2021 | Sawata | H02K 9/00 |

FOREIGN PATENT DOCUMENTS

WO 2021/148744 A1 7/2021

OTHER PUBLICATIONS

Evtol; "Honeywell Annouces Microvcs Cooling Solution for Electric Aircraft"; Jun. 21, 2020; 3 pgs.; (https://evtol.com/news/honeywell-microvcs-cooling-electric-aircraft/).

* cited by examiner

*Primary Examiner* — Long T Tran
(74) *Attorney, Agent, or Firm* — Dinsmore & Shohl LLP

(57) ABSTRACT

A hybrid cooling system of an electric machine is contemplated. The hybrid cooling system comprises a propeller positioned on an exterior of an enclosure, at least one electronic component disposed within the enclosure, and a vapor chamber disposed within the enclosure, wherein the vapor chamber comprises an actuator configured to generate mist from a liquid coolant within the enclosure. In operation, in a first mode, the propeller rotates for generating air that is channeled into the enclosure via fins that are disposed on exterior portions of the enclosure, and in a second mode, the actuator generates mist within the vapor chamber, and the propeller rotates for generating air that is channeled into the enclosure via the fins disposed therein.

20 Claims, 6 Drawing Sheets

VIBRATING ACTUATOR BASED HYBRID COOLING SYSTEMS FOR ELECTRIC MACHINES

TECHNICAL FIELD

The embodiments described herein generally relate to hybrid cooling systems, in particular, to a dual mode cooling systems of an electric machine in which an actuator vibrating within a vapor chamber of the electric machine combined with a propeller of the machine is utilized to cool various components of the machine.

BACKGROUND

Electric vertical take-off and landing (eVTOL) vehicles may take off from a source location, e.g., with cargo in the form of purchased goods, for delivery to a location, travel a certain distance in the air, drop off the cargo, and return to the source location. Operation of eVTOL vehicles, however, suffer from deficiencies. For example, during take-off and landing operations, components included within the eVTOL vehicles may experience sudden increases in operating temperatures due to increased power demands, which adversely impact the operational life of these components, and by extension, the operational life of eVTOL vehicles.

Accordingly, a need exists for alternative cooling systems that cools the stator, motor, and various components of the eVTOL vehicles during specific vehicle operating conditions, e.g., take-off, landing, hovering, cruising, and so forth.

SUMMARY

In one embodiment, a hybrid cooling system of an electronic machine is provided. The hybrid cooling system comprises a propeller positioned on an exterior of an enclosure, at least one electronic component disposed within the enclosure, and a vapor chamber disposed within the enclosure, wherein the vapor chamber comprises an actuator configured to generate mist from a liquid coolant within the enclosure, wherein in a first mode, the propeller rotates for generating air that is channeled into the enclosure via fins that are disposed on exterior portions of the enclosure, and in a second mode the actuator generates mist within the vapor chamber, and the propeller rotates for generating air that is channeled into the enclosure via the fins disposed therein.

In another embodiment, another hybrid cooling system of an electric machine is provided. The hybrid cooling system comprises a propeller positioned on an exterior of an enclosure, at least one electronic component disposed within the enclosure, and a vapor chamber disposed within the enclosure, wherein the vapor chamber comprises an actuator configured to generate mist from a liquid coolant within the enclosure, wherein, in a mode, the actuator generates mist within the vapor chamber, and the propeller rotates for generating air that is channeled into the enclosure via fins disposed on an exterior portion of the enclosure.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Electric vertical take-off and landing vehicles may provide a way of delivering goods to various locations in a cost and energy efficient manner. However, as stated above, eVTOL vehicles suffer from a deficiency. During specific operation conditions such as, e.g., take-off, landing, and hovering, the operating temperatures of the components within eVTOL vehicles may exceed threshold operational temperatures, namely threshold operational temperatures that are considered suitable for ensuring long operational life for these components.

The embodiments described herein address and overcome the above described deficiency. In particular, the embodiments of the present disclosure describe a vibrating actuator based hybrid cooling system of an electric machine (e.g., an eVTOL vehicle) that utilizes multiple distinct cooling modes to cool the components of the eVTOL vehicle. During operating conditions such as take-off, landing, and hovering conditions, the high density operations of various components (e.g., power electronics components of inverter circuits and/or batteries) of the eVTOL vehicle may cause sudden increases in the operating temperatures of these components. To reduce such temperatures, the eVTOL vehicles of the present disclosure utilize the operation of both the propeller of the eVTOL vehicle and an actuator disposed within a liquid coolant that is included in a vapor chamber of the eVTOL vehicle. In particular, the air generated by rotation of the propeller of the eVTOL vehicle and droplets of water generated by actuator vibration within the liquid coolant may ensure that the operating temperatures of various components of the eVTOL vehicle, e.g., stators, rotors, power electronics devices, controllers, and so forth, are maintained within a threshold temperature or threshold temperature range. On the other hand, at times when the operating temperatures of these components are low (e.g., when the eVTOL is airborne and cruising at an altitude for a particular time frame), the eVTOL vehicle may operate in a single cooling mode, in which the actuator may be in an inactive state and only the propeller of the eVTOL vehicle may rotate to generate air for cooling the various components.

It is noted that although the embodiments described herein are directed to and relate broadly to eVTOL vehicles, these embodiments are not limited thereto. The embodiments described herein may be applicable to electric motors that are included in a variety of machines, e.g., automobiles, machines that are capable of traveling on land, water, and/or air, and any combination thereof. It is noted that the embodiments described herein may be employed in any machine in which there is a transitory increase in electric power.

Figure 1:
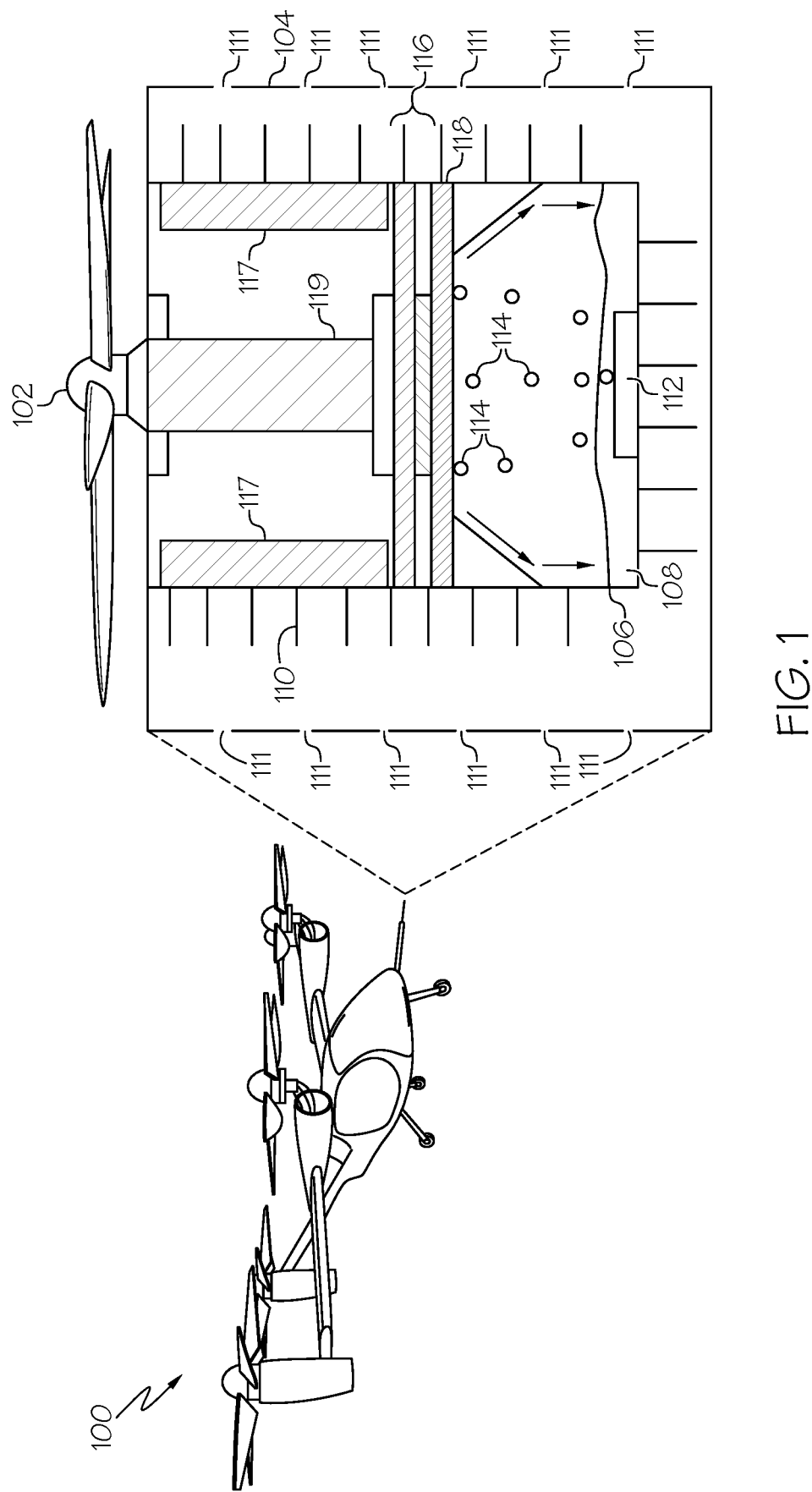
FIG. 1 depicts an example implementation of a vibrating actuator based hybrid cooling system included as part of an eVTOL vehicle, according to one or more embodiments described and illustrated herein.

FIG. 1 depicts an example implementation of the vibrating actuator based hybrid cooling system included as part of an eVTOL vehicle, according to one or more embodiments described and illustrated herein. As eVTOL vehicle 100 refers to an aircraft that is capable of travelling in the air, or in the air and on land, using primarily or exclusively electric power. In embodiments, the eVTOL vehicle 100 may include a plurality of propellers positioned on wings that protrude from the sides and a rear portion of the eVTOL vehicle 100. In embodiments, the eVTOL vehicle 100 also includes an electric motor assembly 115 that comprises a stator 117, a rotor 119, and at least one electric component (e.g., a power electronics device or a plurality of power electronics devices 116), and a controller 118 (e.g., a computing device). In embodiments, as illustrated in FIG. 1, the eVTOL vehicle 100 may include a propeller 102 that is disposed or positioned on a top portion of a rotor 119. The rotor 119 and the stator 117 may be disposed at least partially within an enclosure 104. Inlets 111 may be provided on the enclosure 104 for air generated by rotation of the propeller 102 to be channeled in the enclosure 104 for cooling the stator 117, the rotor 119, the power electronics devices 116, and/or the controller 118. It is noted that, in embodiments, the enclosure 104 may include a vapor chamber 106. The vapor chamber 106 includes a liquid coolant 108 that may be positioned on a bottom portion of the vapor chamber 106. Additionally, in embodiments, an actuator 112 may be positioned at the base of the vapor chamber 106 and disposed within the liquid coolant 108. In embodiments, the actuator 112 may be a piezoelectric optimizer. It is noted that, in embodiments, the actuator 112 based hybrid cooling system included as part of the eVTOL vehicle 100 may facilitate operation of the eVTOL vehicle 100 in two distinct modes—single cooling mode and dual cooling mode.

In the single cooling mode, which may occur at times of lower power demand such as cruising, the propeller 102 may rotate at a particular speed and generate air that may pass over the fins 110. This air may serve to cool various components of the eVTOL vehicle 100, in particular, the stator 117, the rotor 119, and power electronics devices 116. In the single cooling mode, controller 118 may function to de-activate operation of the actuator 112 or ensure that the actuator 112 does not turn on. In other words, during the single cooling mode, in embodiments, only the air generated by the rotation of the propeller 102 may be utilized to cool each of the various components included in the eVTOL vehicle 100.

In contrast, in the dual cooling mode, which may occur at times of high power demand such as lift off, landing, and hovering, air for cooling of the various components of the eVTOL vehicle may be generated by the propeller 102. Simultaneously, the controller 118 may initiate operation of the actuator 112, as a result of which the actuator 112 may begin vibrating at a particular rate for a predetermined period time. Consequently, mist or droplets 114 may be generated, which may travel upwards towards the top portion of the vapor chamber 106. Upon contact, the top portion of the vapor chamber 106, these droplets serve to cool the power electronics devices 116 and the controller 118.

Figure 2A:
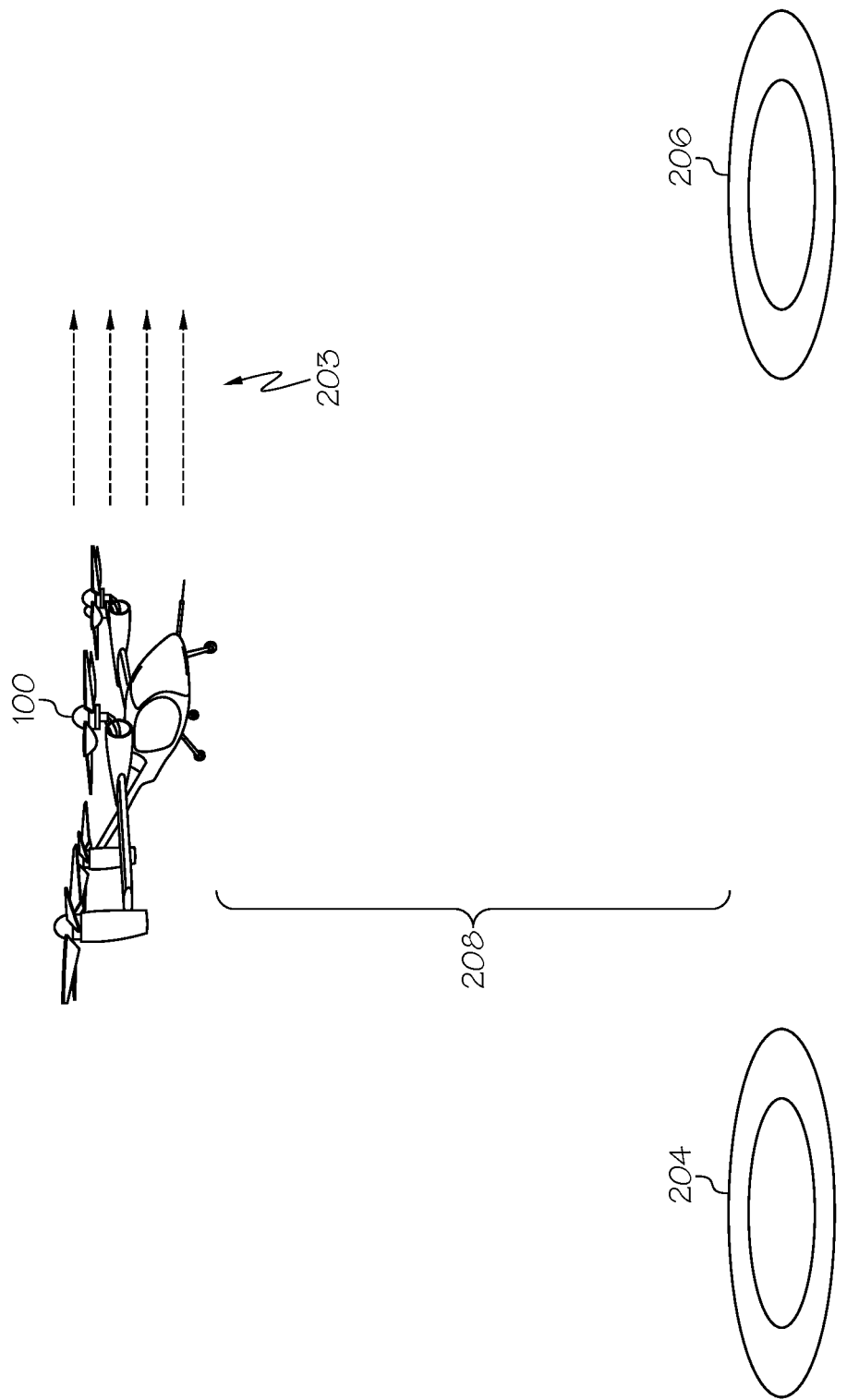
FIG. 2A depicts an example operation of an eVTOL vehicle in a cruise mode, according to one or more embodiments described and illustrated herein.

FIG. 2A depicts an example operation of an eVTOL vehicle 100 operating in a cruise mode 203, according to one or more embodiments described and illustrated herein. For example, FIG. 2A illustrates an eVTOL vehicle 100 that takes off from a source location 204, e.g., a landing area outside a warehouse or a distribution center, etc. After takeoff, the eVTOL may remain airborne for a certain period of time, and travel to a destination location 206. It is noted that, in embodiments, the cruise mode 203 may be automatically initiated by the controller 118. In embodiments, the triggering events for the automatic initiation of the cruise mode 203 may be associated with various operating conditions.

In particular, the controller 118 may determine whether the eVTOL vehicle 100 has been traveling at a particular threshold altitude 208 for a predetermined time frame, in addition to determining whether the eVTOL vehicle 100 has been traveling at a constant speed for a predetermined time frame. It is also noted that controller 118 is also configured to determine, in real time, the temperatures of and power drawn by each of the various components of the eVTOL vehicle 100. Based on these conditions, the controller 118 may activate, automatically and without user intervention, operation of the eVTOL vehicle 100 in the cruise mode 203. Alternatively, the controller 118, upon determining that the eVTOL vehicle 100 has reached a particular altitude (e.g., 1000 feet-1500 feet), may automatically activate the cruise mode 203.

In embodiments, the controller 118 may activate the cruise mode 203 based solely on the amount of time that the eVTOL vehicle 100 has been traveling at a particular altitude, even if the eVTOL vehicle 100 may be determined to be travelling at varying speeds. In embodiments, the controller 118 may activate the cruise mode 203 when the eVTOL is determined to be traveling at a constant speed for a predetermined period of time, irrespective of the altitude at which the eVTOL vehicle 100 may be traveling. In other embodiments, the controller 118 may activate the cruise mode 203 upon determining that the propeller 102 has been rotating at a threshold rotations per minute ("rpm") for a predetermined time frame. In embodiments, any permutation or combination of the above described conditions may be utilized by the controller 118 to activate the cruise mode 203. Upon activation of the cruise mode 203, the controller 118 may also activate a single cooling mode (concurrently or sequentially), in which the rotation of the propeller 102 may be the primary or solitary component utilized for cooling the various components of the eVTOL vehicle 100.

Figure 2B:
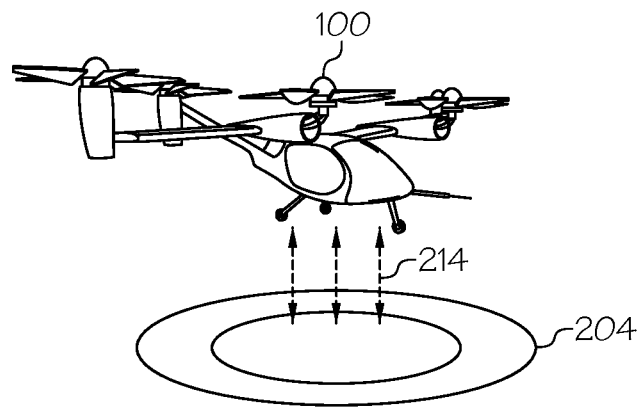
FIG. 2B depicts an example operation of the eVTOL vehicle in a hovering mode, according to one or more embodiments described and illustrated herein.
Figure 2C:
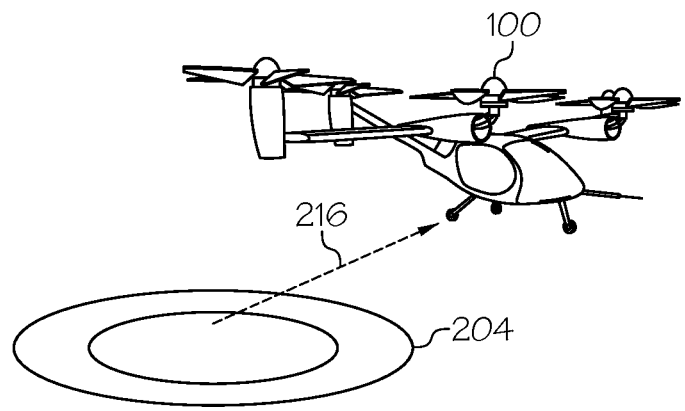
FIG. 2C depicts the eVTOL vehicle during take-off, according to one or more embodiments described and illustrated herein.
Figure 2D:
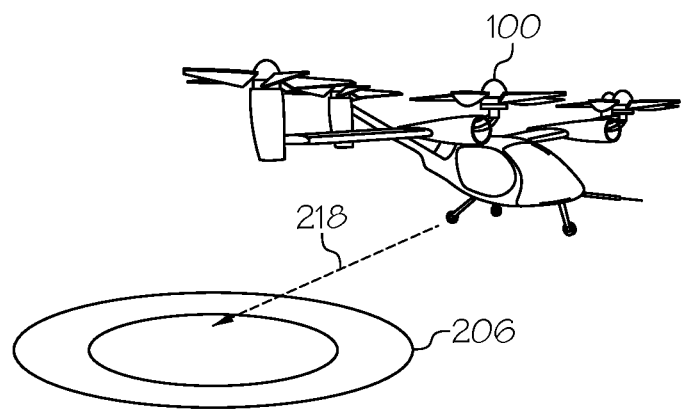
FIG. 2D depicts the eVTOL vehicle during landing, according to one or more embodiments described and illustrated herein.

FIG. 2B depicts an example operation of the eVTOL vehicle 100 in a hovering mode 214, according to one or more embodiments described and illustrated herein. In particular, the controller 118 may automatically trigger the hovering mode 214 for the eVTOL vehicle 100 upon determining, e.g., that the eVTOL vehicle 100 is within a particular geographic radius or distance of the destination location 206, e.g., a location where the eVTOL vehicle 100 may be configured to deliver a package. For example, if the eVTOL vehicle 100 is within 20 feet from the destination location 206 and is traveling at an altitude of 20 feet directly over a landing area associated with the destination location 206, the controller 118 may automatically activate the hovering mode 214, e.g., for facilitating an accurate landing and offloading or delivery of goods. In response, the eVTOL vehicle 100 may reduce or stop lateral or diagonal movement of the eVTOL vehicle 100 in excess of a threshold amount (e.g., 1-3 feet) and ensure that the vehicle maintains its position at a particular altitude, e.g., 20 feet from the landing area for a predetermined time frame.

In embodiments, the eVTOL vehicle 100 may be in the hovering mode 214 for various reasons, e.g., until other vehicles, obstructions, individuals, and so forth, are cleared from the landing area. In other embodiments, the eVTOL vehicle 100 may be manually controlled such that upon receiving instructions from an external device such as a remote control device (not shown) operated by an individual, the eVTOL vehicle 100 may enter a hovering mode 214. In other embodiments, the presence of particular operating conditions of the eVTOL vehicle 100 may automatically trigger the hovering mode 214 of the eVTOL vehicle 100. For example, if the eVTOL vehicle 100 is operated manually, and the controller 118 determines that the vehicle has been airborne, is positioned at a particular altitude, and fails to deviate in any particular direction (e.g., vertically, horizontally, or diagonally) in excess of a specific magnitude for a predetermined time frame, the controller 118 may trigger activation of the hovering mode 214. Alternatively, the controller 118 may associate such conditions or classify operation of the eVTOL vehicle 100 under these conditions as operating in the hovering mode 214.

In the hovering mode 214, the operating temperatures of the stator, rotor, power electronics devices 116, and the controller 118 are higher than when the eVTOL vehicle 100 is operating in the cruise mode 203. As such, the controller 118 may, automatically and without user intervention, activate operation of the eVTOL vehicle 100 in a dual cooling mode for reducing or maintaining the operating temperatures of the stator, rotor, and the power electronics devices 116 to within a particular temperature threshold or temperature threshold range. In embodiments, in the dual cooling mode, the various components of the eVTOL vehicle 100 may be based on multiple factors. In particular, in the dual cooling mode, these components may be cooled by both the mist generated by vibration of the actuator 112 within the liquid coolant 108 and the air generated by the rotation of the propeller 102. The air generated by the propeller 102 may be channeled into the enclosure 104 via the inlets 111 disposed on exterior portions of the enclosure 104 (e.g., for cooling the various components) and the mist generated by actuator vibration may generate droplets that may contact the top portion of the vapor chamber 106, which is positioned directly underneath the controller 118 and the power electronics devices 116. In this way, the droplets generated by the actuator 112 and the air generated by the propeller 102 may both be used to cool the power electronics devices 116 and the controller 118.

In embodiments, a plurality of temperature sensors may be included as part of the eVTOL vehicle 100, e.g., within the enclosure 104 and within a particular proximity of each of the stator 117, the rotor 119, and the power electronics devices 116. In embodiments, a plurality of current sensors, may also be positioned in the enclosure 104, e.g., within a proximity of each of the stator 117, the rotor 119, and the power electronics devices 116. These sensors may be utilized to monitor current and temperature variations.

Figure 3A:
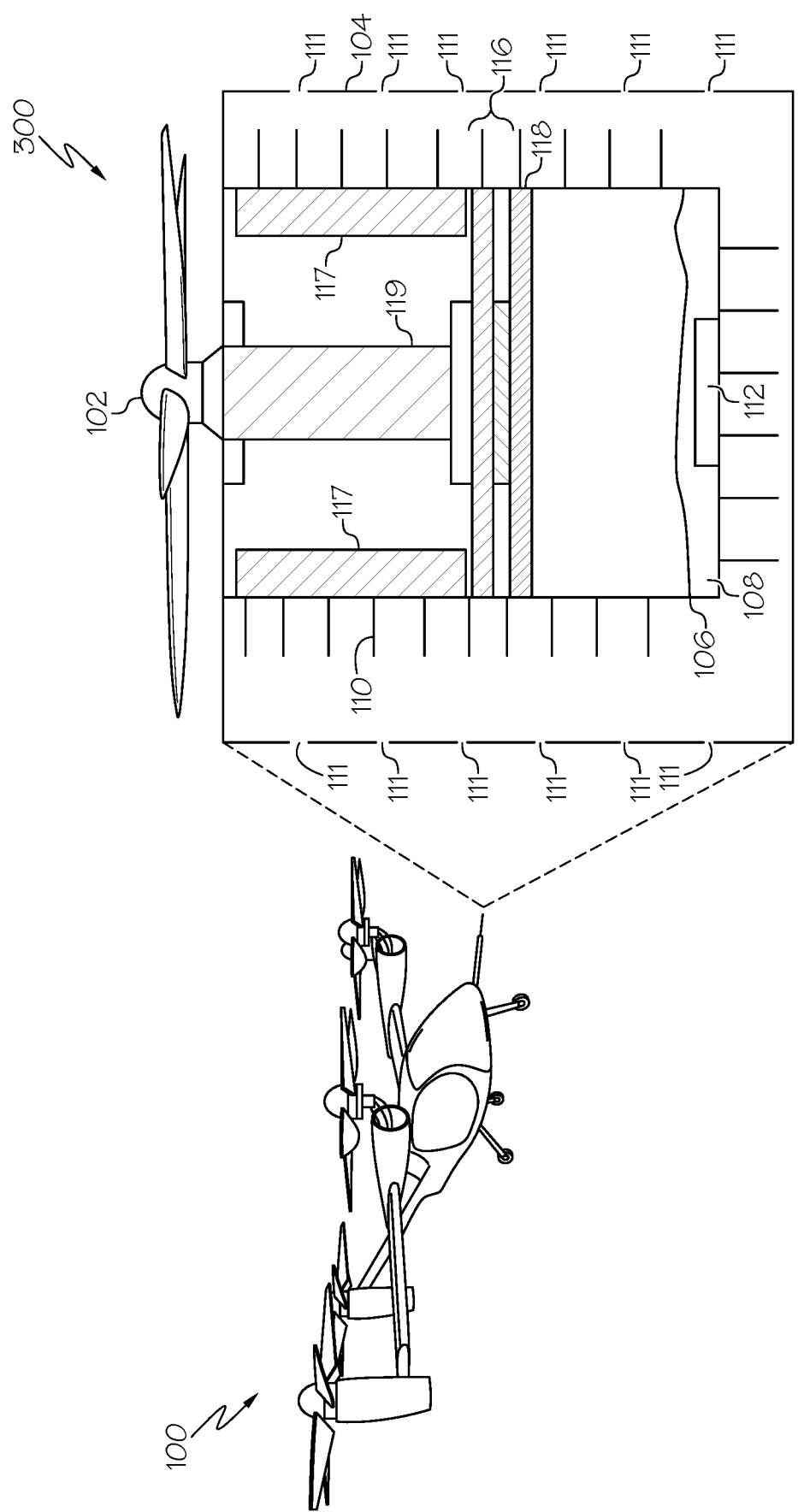
FIG. 3A depicts an example operation of the eVTOL vehicle in a single cooling mode, in which the components of the eVTOL vehicle are cooled using the rotation of the propeller, according to one or more embodiments described and illustrated herein.

FIG. 3A depicts an example operation 300 of the eVTOL vehicle 100 in a cruising mode, according to one or more embodiments described and illustrated herein. In particular, the eVTOL vehicle 100 operating in the cruise mode 203, as described above, may be when the eVTOL vehicle 100 has been airborne for a particular amount of time, e.g., e.g., anywhere between 2 minutes to 20 minutes or longer, and may be traveling at a particular altitude for a predetermined time frame. Moreover, in the cruise mode 203, the eVTOL vehicle 100 may be traveling at a predefined speed for a particular period of time, e.g., for the majority of the time that the eVTOL vehicle 100 has been airborne. For this time, the propeller 102 may be rotating at a consistent speed, e.g., 1500-2500 rotations per minute, which generates air for cooling each of the power electronics devices 116, the stator 117, the rotor 119, and the controller 118 (e.g., a computing device). It is noted that, in the single cooling mode, the actuator 112 is maintained in an inactive state by the controller 118. In other words, in embodiments, if the controller 118 determines that the temperatures associated with the power electronics devices 116 is within a particular threshold range, in particular during the cruising mode 203, the controller 118 may determine that the air generated by the propeller 102 is enough for the purposes of cooling the power electronics devices 116, the controller 118, the stator 117, and the rotor 119. As such, in embodiments, the controller 118 may maintain actuator 112 in a deactivated or inactive state for the entirety of the time that the eVTOL vehicle 100 is in the cruise mode 203.

Figure 3B:
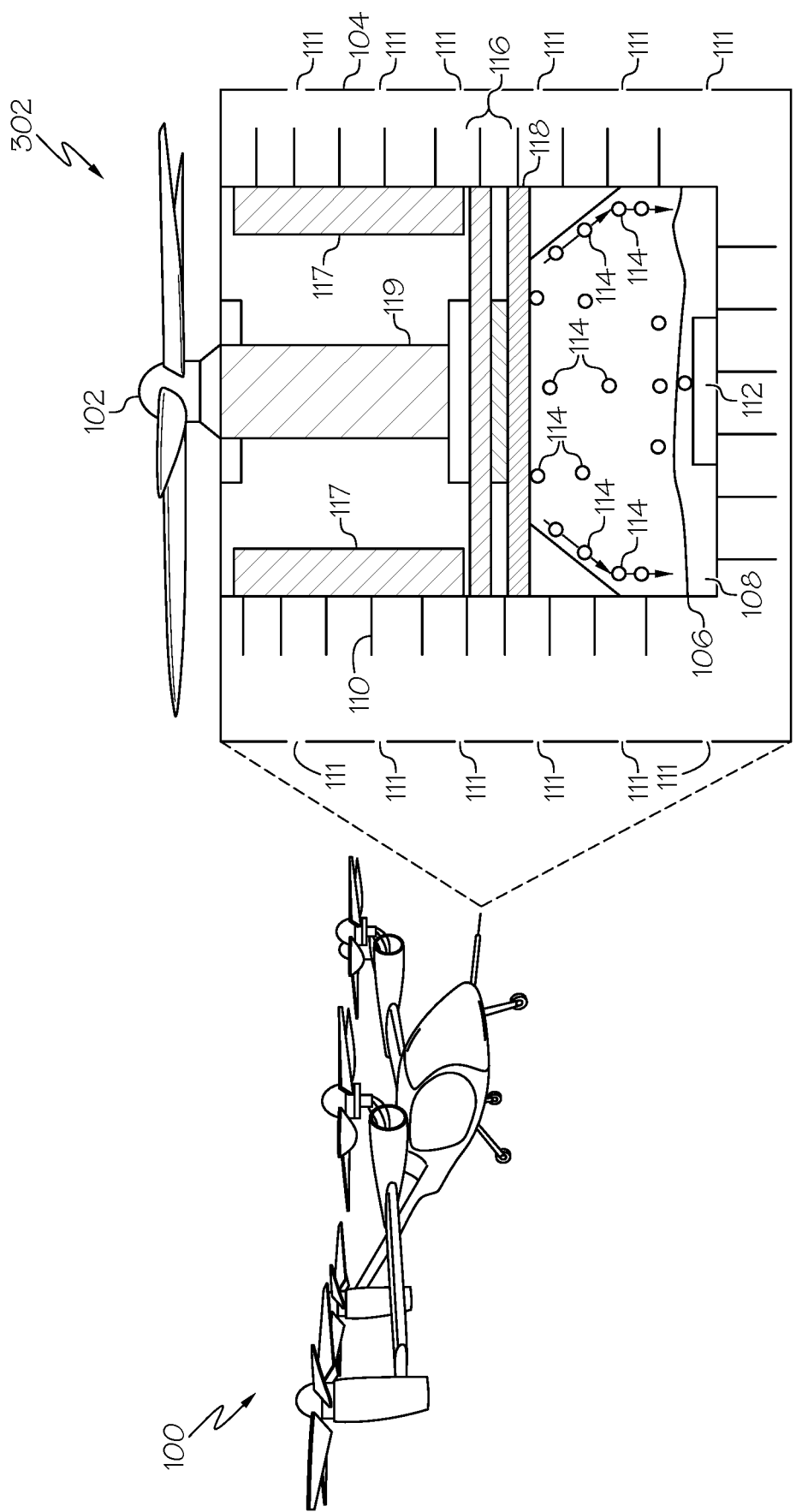
FIG. 3B depicts an example operation of the eVTOL vehicle in a dual cooling mode, in which the components of the eVTOL vehicle are cooled using the rotation of the propeller and the operation of the actuator, according to one or more embodiments described and illustrated herein.

FIG. 3B depicts an example operation 302 of the eVTOL vehicle 100 when the eVTOL takes off from the source location 204, e.g., landing pad or helipad, and is preparing to land in the destination location 206. In embodiments, as stated above, the operating temperatures of the power electronics devices 116 are particularly high during specific operations of the eVTOL vehicle 100, e.g., during a hovering operation, take-off operation, and landing operation of the eVTOL vehicle 100. During these operations, rapid cooling will help ensure that the power electronics devices 116 are not damaged. It is noted that, during the take-off and landing operations, the temperatures sensors, the current sensors, and so forth, which may be disposed on or near the power electronics devices 116, the controller 118, the stator 117, and the rotor 119, may detect a sudden spike in temperatures of one or more of these components. In response, the controller 118 may activate the actuator 112 within the liquid coolant 108. In embodiments, the activation may cause the actuator 112 to vibrate at a particular frequency for a predetermine time frame. It is noted that the frequency or speed of vibration of the actuator 112 may be varied.

For example, if the spike in temperatures of the one or more components of the eVTOL vehicle 100 exceeds a particular threshold, the controller 118 may set a vibrating frequency of the actuator 112 to a particular value, which will cause the actuator 112 to vibrate within the liquid coolant 108 and generate a particular amount of the droplets 114. These droplets will travel upwards and contact the upper portion of the vapor chamber 106 in order to reduce the detected temperature spike within a particular time frame. If the droplets 114 or mist fail to reduce the temperature spike by a threshold value, the controller 118 may increase the vibration frequency of the actuator 112, which in turn will result in the generation of additional droplets that travel upwards and contact the upper portion of the vapor chamber 106, which is in direct contact with the controller 118 and the power electronics devices 116. In this way, the droplets 114 and the air generated by the propeller 102 may be utilized to cool the power electronics devices 116, the controller 118, the stator 117, and the rotor 119.

In embodiments, if the components of the eVTOL vehicle 100 are cooled such that the temperatures associated with these components are detected to be below a particular threshold value, the controller 118 may reduce the vibration frequency of the actuator 112 or entirely deactivate the vibration of the actuator 112. Consequently, any generation of additional droplets will be stopped. In embodiments, the upper portion of the vapor chamber 106 may be coated with a hydrophobic coating, which serves to repel the droplets 114 from the upper portion and redirect the droplets 114 along the diagonal sides of the vapor chamber 106, as illustrated in FIG. 3B, such that these droplets 114 fall back into and become a part of the liquid coolant 108. In this way, a limited quantity of the liquid coolant 108 may be utilized to cool the various components of the eVTOL vehicle 100, namely the power electronics devices 116, the controller 118, the stator 117, and the rotor 119.

Figure 4:
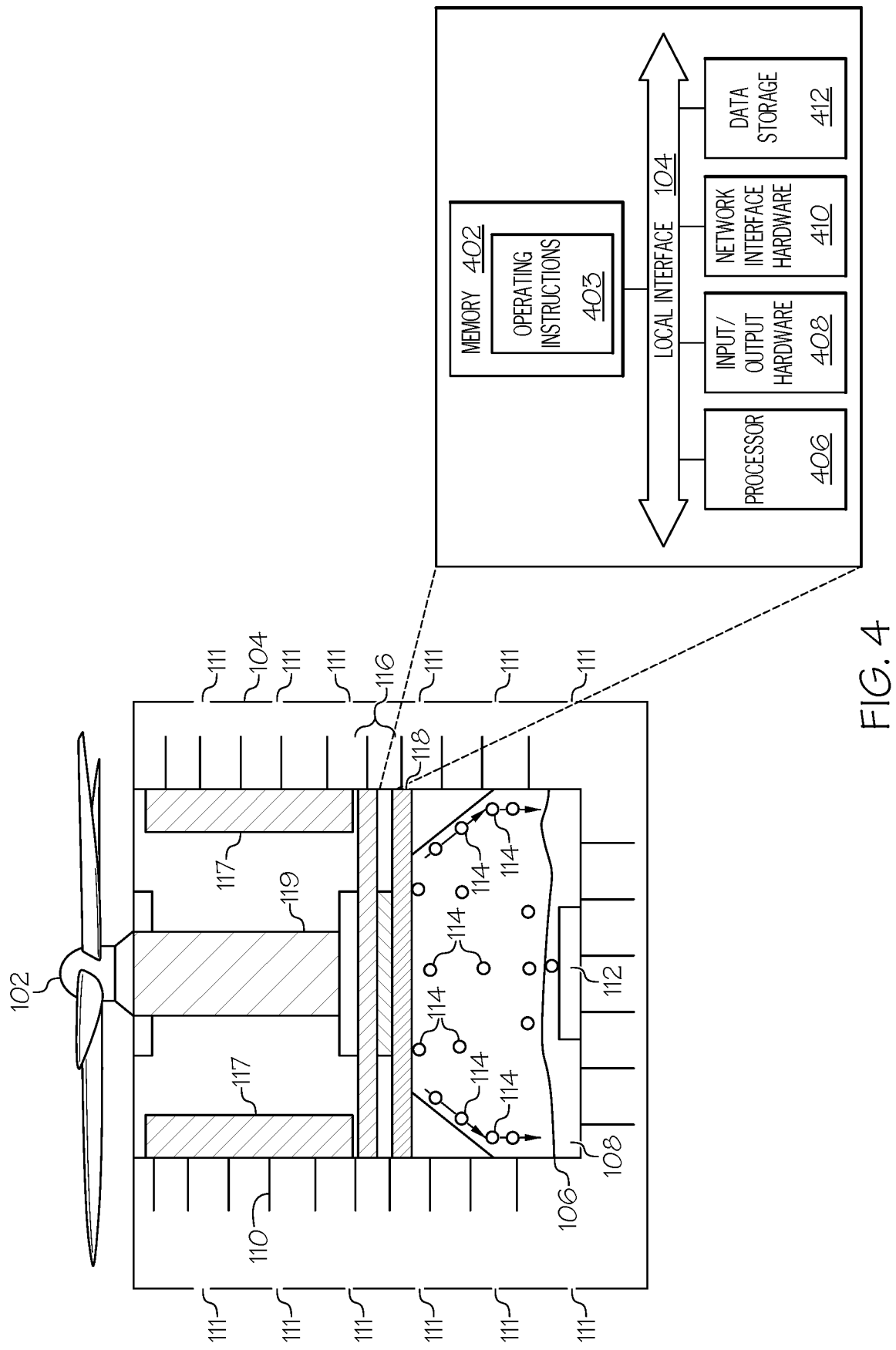
FIG. 4 depicts a non-limiting example of a controller that is configured to perform one or more of the features and functionalities described in the present disclosure, according to one or more embodiments described and illustrated herein.

FIG. 4 depicts a non-limiting example of the controller 118 that is configured to perform one or more of the features and functionalities described in the present disclosure, according to one or more embodiments described and illustrated herein. As illustrated, the controller 118 includes a processor 406, input/output hardware 408, a network interface hardware 410, a data storage component 412, and memory 402. The memory 402 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD) (whether local or cloud-based), and/or other types of non-transitory computer-readable medium. Depending on the particular embodiment, these non-transitory computer-readable media may reside within the computing device and/or a device that is external to the controller 118.

The memory 402 may store operating instructions 403, each of which may be embodied as a computer program, firmware, and so forth. The memory 402 may comprise RAM, ROM, flash memories, hard drives, or any device capable of storing the operating instructions 403 such that the operating instructions 403 can be accessed by the processor 406. The operating instructions 403 may comprise logic or algorithm(s) written in any programming language of any generation (e.g., 1GL, 2GL, 3GL, 4GL, or 5GL) such as, for example, machine language that may be directly executed by the processor, or assembly language, object-oriented programming (OOP), scripting languages, microcode, etc., that may be compiled or assembled into machine readable and executable instructions and stored on the memory 402. Alternatively, the operating instructions 403 may be written in a hardware description language (HDL), such as logic implemented via either a field-programmable gate array (FPGA) configuration or an application-specific integrated circuit (ASIC), or their equivalents. Accordingly, the methods described herein may be implemented in any conventional computer programming language, as pre-programmed hardware elements, or as a combination of hardware and software components. The processor 406 along with the memory 402 may operate as a controller for the controller 118.

A local interface 404 is also included in FIG. 1 and may be implemented as a bus or other communication interface to facilitate communication among the components of the controller 118. The processor 406 may include any processing component operable to receive and execute operating instructions 403 from the memory 402 (such as from a data storage component 412 and/or the memory 402). Accordingly, the 406 may be an integrated circuit, a microchip, a computer, or any other computing device.

The operating instructions 403 may include an operating system and/or other software for managing components of the controller 118. It should be understood that while the component in FIG. 1 are illustrated as residing within the controller 118, this is merely an example. In some embodiments, one or more of the components may reside external to the controller 118 or within other devices. It should be understood that, while the controller 118 is illustrated as a single device, this is also merely an example. As an example, one or more of the functionalities and/or components described herein may be provided by the controller 118. Depending on the particular embodiments, any of these device may have similar components as those depicted in FIG. 1. To this end, any of these devices may include instructions for performing the functionality described herein.

It should now be understood that the embodiments of the present disclosure are directed to a vibrating actuator based hybrid cooling system of an electric machine. The vibrating actuator based hybrid cooling system comprises a propeller positioned on an exterior of an enclosure, at least one electronic component disposed within the enclosure, and a vapor chamber disposed within the enclosure, wherein the vapor chamber comprises an actuator configured to generate mist from a liquid coolant within the enclosure, wherein: in a first mode, the propeller rotates for generating air that is channeled into the enclosure via fins that are disposed on exterior portions of the enclosure, and in a second mode: the actuator generates mist within the vapor chamber, and the propeller rotates for generating air that is channeled into the enclosure via the fins disposed therein.

In a first aspect, a hybrid cooling system of an electric machine comprises a propeller positioned on an exterior of an enclosure, at least one electronic component disposed within the enclosure, and a vapor chamber disposed within the enclosure, wherein the vapor chamber comprises an actuator configured to generate mist from a liquid coolant within the enclosure, wherein in a first mode, the propeller rotates for generating air that is channeled into the enclosure via fins that are disposed on exterior portions of the enclosure, and in a second mode the actuator generates mist within the vapor chamber, and the propeller rotates for generating air that is channeled into the enclosure via the fins disposed therein.

In a second aspect, the hybrid cooling system of the first aspect, wherein the electric machine is a component of an eVTOL vehicle.

In a third aspect, the hybrid cooling system of the second aspect, wherein the first mode corresponds to a cruise mode in which the eVTOL vehicle is airborne and traveling at a predefined speed.

In a fourth aspect, the hybrid cooling system of the third aspect, wherein the actuator is a piezoelectric optimizer that is disabled when the hybrid cooling system is in the cruise mode.

In a fifth aspect, the hybrid cooling system of any of the first to the fourth aspects, wherein the at least one electronic component is positioned on an exterior surface of the vapor chamber.

In a sixth aspect, the hybrid cooling system of any of the first to the fifth aspects, wherein an inner surface of the vapor chamber is coated with a hydrophobic coating.

In a seventh aspect, the hybrid cooling system of the sixth aspect, wherein the mist contacts the hydrophobic coating on the inner surface and detaches from the inner surface based on the contact.

In an eight aspect, the hybrid cooling system of the second, third, or fourth aspect, wherein the second mode corresponds to at least one of a take-off operation and a landing operation of the eVTOL vehicle.

In a ninth aspect, the hybrid cooling system of any of the first to the eights aspects, wherein in the second mode, the mist, generated by the actuator, contacts an inner surface of the vapor chamber for cooling the inner surface.

In a tenth aspect, the hybrid cooling system of the ninth aspect, wherein the at least one electronic component is disposed on an outer surface of the vapor chamber and are cooled based on the mist contacting the inner surface of the vapor chamber.

In an eleventh aspect, a hybrid cooling system of an electric machine comprises a propeller positioned on an exterior of an enclosure, at least one electronic component disposed within the enclosure, and a vapor chamber disposed within the enclosure, wherein the vapor chamber comprises an actuator configured to generate mist from a liquid coolant within the enclosure, wherein, in a mode: the actuator generates mist within the vapor chamber, and the propeller rotates for generating air that is channeled into the enclosure via fins disposed on an exterior portion of the enclosure.

In a twelfth aspect, the hybrid cooling system of the eleventh aspect, wherein the electric machine is a component of an eVTOL vehicle.

In a thirteenth aspect, the hybrid cooling system of the twelfth aspect, wherein the mode corresponds to a cruise mode in which the eVTOL vehicle is airborne and traveling at a predefined speed.

In a fourteenth aspect, the hybrid cooling system of the twelfth aspect, wherein in a different mode, the propeller rotates for generating air that is channeled into the enclosure via the fins that are disposed exterior portions of the enclosure, the different mode corresponds to a cruise mode in which the eVTOL vehicle is airborne and traveling at a predefined speed.

In a fifteenth aspect, the hybrid cooling system of the eleventh to the fourteenth aspect, wherein the actuator is a piezoelectric optimizer that is disabled when the hybrid cooling system is in a cruise mode.

In a sixteenth aspect, the hybrid cooling system of the eleventh to the fifteenth aspects, wherein the at least one electronic component is positioned on an exterior surface of the vapor chamber.

In a seventeenth aspect, the hybrid cooling system of the eleventh to the sixteenth aspects, wherein an inner surface of the vapor chamber is coated with a hydrophobic coating.

In an eighteen aspect, the hybrid cooling system of the seventeenth aspect, wherein the mist contacts the hydrophobic coating on the inner surface and detaches from the inner surface based on the contact.

In a nineteenth aspect, the hybrid cooling system of the twelfth aspect, wherein the mode corresponds to at least one of a take-off operation of the eVTOL vehicle and a landing operation of the eVTOL vehicle.

In a twentieth aspect, the hybrid cooling system of the nineteenth aspect, wherein in the mode, the mist, generated by the actuator, contacts an inner surface of the vapor chamber for cooling the inner surface.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A hybrid cooling system of an electric machine comprising:
   a propeller positioned on an exterior of an enclosure;
   at least one electronic component disposed within the enclosure; and
   a vapor chamber disposed within the enclosure, wherein the vapor chamber comprises vibrating actuator configured to generate mist from a liquid coolant within the enclosure;
   wherein:
      in a first mode, the propeller rotates for generating air that is channeled into the enclosure via fins that are disposed on exterior portions of the enclosure; and
      in a second mode:
         the vibrating actuator generates mist within the vapor chamber by vibration, and
         the propeller rotates for generating air that is channeled into the enclosure via the fins disposed therein.

2. The hybrid cooling system of claim 1, wherein the electric machine is a component of an eVTOL vehicle.

3. The hybrid cooling system of claim 2, wherein the first mode corresponds to a cruise mode in which the eVTOL vehicle is airborne and traveling at a predefined speed.

4. The hybrid cooling system of claim 3, wherein the actuator is a piezoelectric optimizer that is disabled when the hybrid cooling system is in the cruise mode.

5. The hybrid cooling system of claim 2, wherein the second mode corresponds to at least one of a take-off operation and a landing operation of the eVTOL vehicle.

6. The hybrid cooling system of claim 1, wherein the at least one electronic component is positioned on an exterior surface of the vapor chamber.

7. The hybrid cooling system of claim 1, wherein an inner surface of the vapor chamber is coated with a hydrophobic coating.

8. The hybrid cooling system of claim 7, wherein the mist contacts the hydrophobic coating on the inner surface and detaches from the inner surface based on the contact.

9. The hybrid cooling system of claim 1, wherein in the second mode, the mist, generated by the actuator, contacts an inner surface of the vapor chamber for cooling the inner surface.

10. The hybrid cooling system of claim 9, wherein the at least one electronic component is disposed on an outer surface of the vapor chamber and are cooled based on the mist contacting the inner surface of the vapor chamber.

11. A hybrid cooling system of an electric machine comprising:
    a propeller positioned on an exterior of an enclosure;
    at least one electronic component disposed within the enclosure; and
    a vapor chamber disposed within the enclosure, wherein the vapor chamber comprises a vibrating actuator configured to generate mist from a liquid coolant within the enclosure;
    wherein, in a mode:
        the vibrating actuator generates mist within the vapor chamber by vibration, and
        the propeller rotates for generating air that is channeled into the enclosure via fins disposed on an exterior portion of the enclosure.

12. The hybrid cooling system of claim 11, wherein the electric machine is a component of an eVTOL vehicle.

13. The hybrid cooling system of claim 12, wherein the mode corresponds to a cruise mode in which the eVTOL vehicle is airborne and traveling at a predefined speed.

14. The hybrid cooling system of claim 12, wherein in a different mode, the propeller rotates for generating air that is channeled into the enclosure via the fins that are disposed exterior portions of the enclosure, the different mode corresponds to a cruise mode in which the eVTOL vehicle is airborne and traveling at a predefined speed.

15. The hybrid cooling system of claim 12, wherein the mode corresponds to at least one of a take-off operation of the eVTOL vehicle and a landing operation of the eVTOL vehicle.

16. The hybrid cooling system of claim 15, wherein in the mode, the mist, generated by the actuator, contacts an inner surface of the vapor chamber for cooling the inner surface.

17. The hybrid cooling system of claim 11, wherein the actuator is a piezoelectric optimizer that is disabled when the hybrid cooling system is in a cruise mode.

18. The hybrid cooling system of claim 11, wherein the at least one electronic component is positioned on an exterior surface of the vapor chamber.

19. The hybrid cooling system of claim 11, wherein an inner surface of the vapor chamber is coated with a hydrophobic coating.

20. The hybrid cooling system of claim 19, wherein the mist contacts the hydrophobic coating on the inner surface and detaches from the inner surface based on the contact.

* * * * *